United States Patent
Chandra et al.

(10) Patent No.: US 9,953,873 B2
(45) Date of Patent: Apr. 24, 2018

(54) METHODS OF MODULATING THE MORPHOLOGY OF EPITAXIAL SEMICONDUCTOR MATERIAL

(71) Applicant: GLOBALFOUNDRIES INC., Grand Cayman (KY)

(72) Inventors: Bhupesh Chandra, Wappingers Falls, NY (US); Claude Ortolland, Garrison, NY (US); Gregory G. Freeman, Wappingers Falls, NY (US); Viorel Ontalus, Hopewell Junction, NY (US); Christopher D. Sheraw, Ballston Spa, NY (US); Timothy J. McArdle, Ballston Lake, NY (US); Paul Chang, Ellicott City, MD (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/163,313

(22) Filed: May 24, 2016

(65) Prior Publication Data
US 2017/0345719 A1    Nov. 30, 2017

(51) Int. Cl.
*H01L 21/8234* (2006.01)
*H01L 21/8238* (2006.01)
(Continued)

(52) U.S. Cl.
CPC .. *H01L 21/823418* (2013.01); *H01L 21/0217* (2013.01); *H01L 21/0228* (2013.01);
(Continued)

(58) Field of Classification Search
CPC ..... H01L 21/823418; H01L 21/823468; H01L 21/02299; H01L 21/02274; H01L 21/0228;
(Continued)

(56) References Cited

U.S. PATENT DOCUMENTS

| | | | | |
|---|---|---|---|---|
| 6,150,286 | A * | 11/2000 | Sun | H01L 21/28185 257/E21.293 |
| 7,052,946 | B2 * | 5/2006 | Chen | H01L 29/7843 257/E21.633 |

(Continued)

FOREIGN PATENT DOCUMENTS

| CN | 103646856 | 3/2014 |
|---|---|---|
| KR | 20070058725 | 6/2007 |
| TW | I431760 | 3/2014 |

*Primary Examiner* — Yu Chen
*Assistant Examiner* — Scott Bauman
(74) *Attorney, Agent, or Firm* — Thompson Hine LLP; Yuanmin Cai

(57) ABSTRACT

Chip structures and fabrication methods for forming such chip structures. A first device structure has a structural feature comprised of a first dielectric material and a second device structure has a structural feature comprised of a second dielectric material. A semiconductor layer has a first section adjacent to the structural feature of the first device structure and a second section adjacent to the structural feature of the second device structure. The first section of the semiconductor layer has a popped relationship relative to the structural feature comprised of the first dielectric material. The second section of the semiconductor layer includes a portion that has a pinned relationship relative to a portion of the structural feature comprised of the second dielectric material.

5 Claims, 1 Drawing Sheet

(51) Int. Cl.
*H01L 21/02* (2006.01)
*H01L 21/32* (2006.01)
*H01L 27/088* (2006.01)

(52) U.S. Cl.
CPC .. *H01L 21/02274* (2013.01); *H01L 21/02299* (2013.01); *H01L 21/32* (2013.01); *H01L 21/823468* (2013.01); *H01L 21/823814* (2013.01); *H01L 21/823821* (2013.01); *H01L 21/823864* (2013.01); *H01L 27/088* (2013.01)

(58) Field of Classification Search
CPC ... H01L 21/32; H01L 21/0217; H01L 27/088; H01L 21/823814; H01L 21/823864; H01L 21/823821
See application file for complete search history.

(56) References Cited

U.S. PATENT DOCUMENTS

| | | | |
|---|---|---|---|
| 7,306,983 B2* | 12/2007 | Chidambarrao | H01L 21/31116 257/E21.252 |
| 7,365,403 B1 | 4/2008 | Ramkumar | |
| 7,867,918 B1 | 1/2011 | Ramkumar | |
| 8,358,012 B2* | 1/2013 | Haran | H01L 21/28518 257/382 |
| 8,524,616 B2 | 9/2013 | Kim et al. | |
| 9,093,554 B2* | 7/2015 | Flachowsky | H01L 21/82380 |
| 2005/0136606 A1* | 6/2005 | Rulke | H01L 21/3185 438/305 |
| 2013/0161751 A1* | 6/2013 | Chung | H01L 21/82341 257/368 |
| 2015/0008538 A1* | 1/2015 | Nandakumar | H01L 21/82341 257/408 |
| 2015/0179654 A1* | 6/2015 | Mehrotra | H01L 27/1104 257/77 |

* cited by examiner

US 9,953,873 B2

METHODS OF MODULATING THE MORPHOLOGY OF EPITAXIAL SEMICONDUCTOR MATERIAL

BACKGROUND

The invention relates generally to semiconductor devices and integrated circuit fabrication and, in particular, to chip structures and fabrication methods for forming such chip structures.

Modern electronics achieve high levels of functionality in small and compact form factors by integrating multiple functions onto a single chip. A common fabrication process that allows high levels of integration at a relatively low cost is complementary metal-oxide-semiconductor (CMOS). CMOS processes build a combination of p-channel and n-channel metal-oxide-semiconductor field-effect transistors (MOSFETs) to implement logic gates and other types of digital circuits, as well as analog circuits.

A field-effect transistor includes a gate structure acting as a control electrode and spaced-apart source and drain regions between which a current can flow. A control voltage applied to a gate electrode of the gate structure controls the flow of current through a channel within the substrate between the source and drain regions.

Epitaxial semiconductor films may be used to modify the performance of field-effect transistors. For example, an epitaxial semiconductor film can be used to increase the carrier mobility through the channel of a field-effect transistor by inducing stresses in the channel. In a p-channel field-effect transistor, hole mobility can be enhanced by applying a compressive stress to the channel. One way in which the compressive stress can be applied is by embedding an epitaxial semiconductor material, such as silicon-germanium, at the ends of the channel. Similarly, electron mobility can be enhanced in an n-channel field-effect transistor by applying a tensile longitudinal stress to the channel. One way in which the tensile stress can be applied is by embedding an embedding an epitaxial semiconductor material, such as silicon doped with carbon, at the ends of the channel. The embedded stressors may operate as source and drain regions of the field effect transistor.

Improved chip structures and fabrication methods for forming such chip structures are needed.

SUMMARY

In an embodiment of the invention, a method includes forming a structural feature of a first device structure and forming a structural feature of a second device structure. A first section of a semiconductor layer is formed adjacent to the structural feature of the first device structure and has a popped relationship relative the structural feature comprised of the first device structure. A second section of the semiconductor layer is formed adjacent to the structural feature of the second device structure and includes a portion that has a pinned relationship relative to a portion of the structural feature of the second device structure.

In an embodiment of the invention, a chip structure includes a first device structure having a structural feature comprised of a first dielectric material and a second device structure having a structural feature comprised of a second dielectric material. A semiconductor layer has a first section adjacent to the structural feature of the first device structure and a second section adjacent to the structural feature of the second device structure. The first section of the semiconductor layer has a popped relationship relative to the structural feature comprised of the first dielectric material. The second section of the semiconductor layer includes a portion that has a pinned relationship relative to a portion of the structural feature comprised of the second dielectric material.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
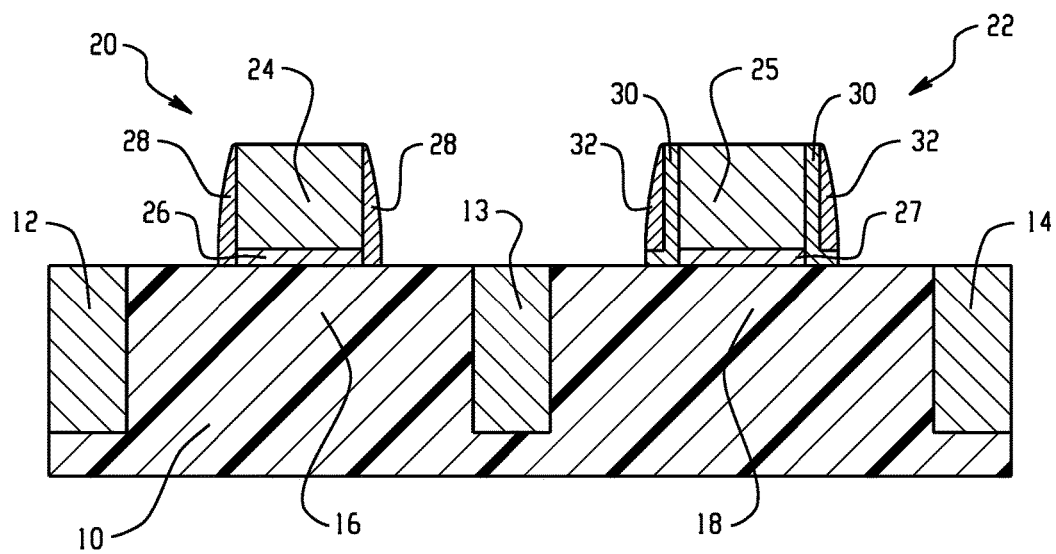
FIG. 1 is a cross-sectional views of a portion of a substrate at an initial fabrication stage of a processing method for fabricating a chip structure in accordance with an embodiment of the invention.

With reference to FIG. 1 and in accordance with an embodiment of the invention, a substrate 10 may be any type of suitable substrate comprising a single-crystal semiconductor material that a person having ordinary skill in the art would recognize as suitable for fabricating an integrated circuit. For example, the substrate 10 may be comprised of a bulk silicon wafer or the device layer of a silicon-on-insulator wafer. The semiconductor material comprising substrate 10 may be lightly doped with a dopant to alter its electrical properties and may also include an optional epitaxial layer.

Trench isolation regions 12, 13, 14 may be formed in the substrate 10 by a shallow trench isolation (STI) technique that relies on photolithography and reactive ion etching to define trenches in substrate 10, deposits a dielectric material to fill the trenches, and planarizes the dielectric material relative to the top surface of the substrate 10 using, for example, chemical mechanical polishing (CMP). The dielectric material comprising the trench isolation regions 12, 13, 14 may be an oxide of silicon (e.g., silicon dioxide) or another electrical insulator deposited by chemical vapor deposition.

A active device region 16 is bounded by trench isolation regions 12, 13 and another active device region 18 is bounded by trench isolation regions 13, 14. The active device regions 16, 18 are comprised of volumes of the semiconductor material of the substrate 10, and are electrically isolated from each other. The active device regions 16, 18 may have contiguous locations, as depicted in the representative embodiment, or may be located in different areas of the substrate 10.

Field-effect transistors 20, 22 may be fabricated using the respective active device regions 16, 18 by complementary metal oxide semiconductor (CMOS) processes during front end of line (FEOL) processing. Field-effect transistor 20 include a gate structure consisting of a gate electrode 24 and a gate dielectric 26, and field-effect transistor 22 include a gate structure consisting of a gate electrode 25 and a gate dielectric 27. The gate electrodes 24, 25 may be comprised of a metal, a silicide, polycrystalline silicon (polysilicon), or combinations of these materials, deposited by physical vapor deposition (PVD), chemical vapor deposition, etc.

The gate dielectrics 26, 27 may be comprised of a dielectric or insulating material, such as silicon dioxide, silicon oxynitride, a high-k dielectric material such as hafnium oxide or hafnium oxynitride, or layered combinations of these dielectric materials, deposited by chemical vapor deposition, atomic layer deposition (ALD), etc. The gate structures may be formed by patterning a layer stack of their constituent materials by photolithography and etching.

Non-conductive spacers 28 are formed on the sidewalls of the gate electrode 24 and gate dielectric 26 providing the gate structure of field-effect transistor 20. The spacers 28 may be formed by depositing a conformal layer 30 comprised of a dielectric material, such as silicon nitride ($Si_3N_4$) deposited by chemical vapor deposition, and shaping the conformal layer with an anisotropic etching process, such as reactive ion etching, that preferentially removes the dielectric material from horizontal surfaces. A portion of the conformal layer 30 form on the sidewalls of the gate electrode 25 and gate dielectric 27 providing the gate structure of field-effect transistor 22. A hardmask or an etch mask may be applied over active device region 18 during the formation of spacers 28 by etching such that the conformal layer 30 is retained in the vicinity of field-effect transistor 22 and, in particular, is retained on the sidewalls of the gate electrode 25 and gate dielectric 27 providing the gate structure of field-effect transistor 22.

The conformal layer 30 used to form spacers 28 may be formed with a given set of properties, such as the substrate temperature during deposition. In an embodiment, the dielectric material of the spacers 28 may be silicon nitride formed by a high-temperature deposition process. In an embodiment, the high temperature process may be low pressure chemical vapor deposition (LPCVD) in which silicon nitride is formed by thermally decomposing reactant process gases, such dichlorosilane (DCS) and ammonia ($NH_3$), at a substrate temperature that is greater than 600° C., such as a substrate temperature in a range of 600° C. to 800° C. or in a range of 700° C. to 800° C. Alternatively, atomic layer deposition (ALD) at similar temperatures, and during which the conformal layer 30 is obtained by multiple deposition of atomic layers of dielectric material, may be used to form the spacers 28.

Non-conductive spacers 32 are formed on the sidewalls of the gate electrode 25 and gate dielectric 27 providing the gate structure of field-effect transistor 22. The spacers 32 may be formed by depositing a conformal layer comprised of a dielectric material, such as silicon nitride ($Si_3N_4$) deposited by chemical vapor deposition, and shaping the conformal layer with an anisotropic etching process, such as reactive ion etching, that preferentially removes the dielectric material from horizontal surfaces. A hardmask or an etch mask 31 is applied over active device region 16 during the formation of spacers 32 such that additional spacers are not formed on the sidewalls of the gate electrode 24 and gate dielectric 26 providing the gate structure of field-effect transistor 20. The spacers 32 cover the residual portion of layer 30 that remains after etching such that the spacers 32 provide the exterior surface at the sidewalls of the gate electrode 24 and gate dielectric 26.

The conformal layer used to form spacers 32 may be formed with a given set of properties, such as the substrate temperature during deposition. In an embodiment, the dielectric material of the spacers 32 may be silicon nitride formed by a low-temperature deposition process. In an embodiment, the low temperature process may be plasma-enhanced chemical vapor deposition (PECVD) in which silicon nitride is formed with a plasma generated from reaction gases, such as silane ($SiH_4$) and ammonia ($NH_3$), at a substrate temperature of less than 400° C., such as a substrate temperature in a range of 200° C. to 400° C. Alternatively, atomic layer deposition (ALD) at similar temperatures and during which a conformal layer is obtained by multiple deposition of atomic layers of dielectric material may be used to form the spacers 32.

Figure 2:
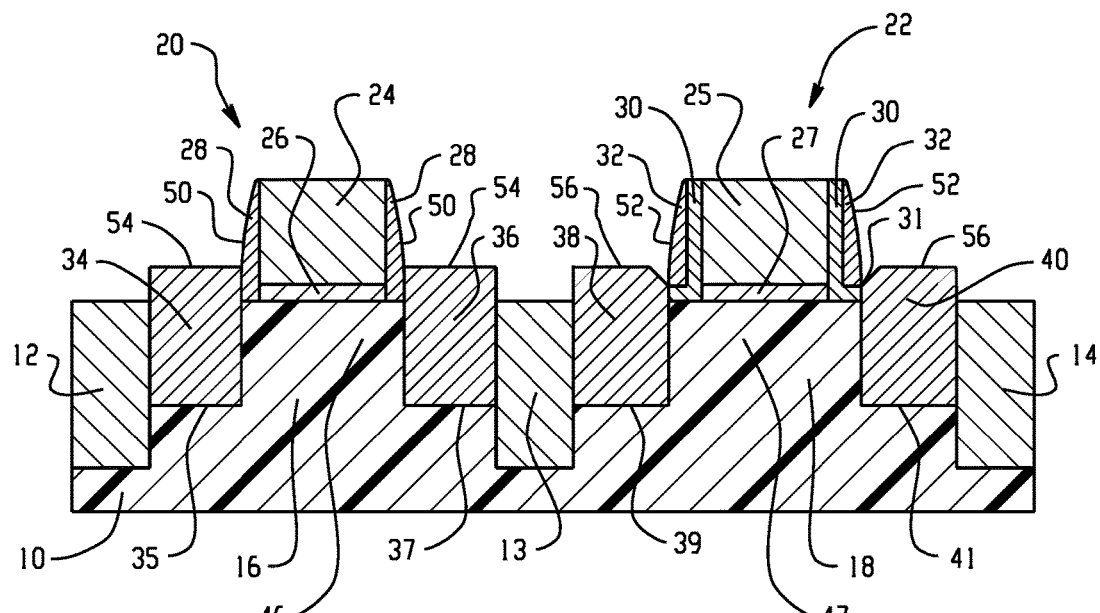
FIG. 2 is a cross-sectional views of the chip structure at a fabrication stage of the processing method subsequent to the fabrication stage of FIG. 1.

With reference to FIG. 2 in which like reference numerals refer to like features in FIG. 1 and at a subsequent fabrication stage, embedded source/drain regions 34, 36 are formed adjacent to the gate electrode 24 and gate dielectric 26 providing the gate structure of field-effect transistor 20. The source/drain regions 34, 36 are comprised of epitaxial semiconductor material that is grown in trenches 35, 37 formed in the active device region 16 adjacent to the gate structure of field-effect transistor 20. The side surfaces of the trenches 35, 37 are generally aligned vertically with side surfaces 50 of the spacers 28 at least at a location of closest proximity of the respective trench mouths to the spacers 28. The raised source/drain regions 34, 36 include a portion that is located in the trenches 35, 37 and another portions that is outside of the trenches 35, 37 and raised.

Embedded source/drain regions 38, 40 are formed adjacent to the gate electrode 25 and gate dielectric 27 providing the gate structure of field-effect transistor 22. The source/drain regions 38, 40 are comprised of epitaxial semiconductor material that is grown in trenches 39, 41 formed in the active device region 18 adjacent to the gate structure of field-effect transistor 22. The side surfaces of the trenches 39, 41 are generally aligned vertically with side surfaces 52 of the spacers 32 at least at a location of closest proximity of the respective trench mouths to the spacers 32. The raised source/drain regions 38, 40 include a portion that is located in the trenches 39, 41 and another portions that is outside of the trenches 39, 41 and raised.

An epitaxial growth process may be used to deposit sections of a semiconductor material, such as silicon germanium (SiGe) or carbon-doped silicon (SiC), to form the raised source/drain regions 34, 36, 38, 40, and may include in situ doping during growth to impart a given conductivity type to the grown semiconductor material. The gate structures may function to self-align the semiconductor material of the raised source/drain regions 34, 36, 38, 40 during epitaxial growth. The epitaxial semiconductor material forming source/drain regions 34, 36 grows adjacent to an exterior surface 50 of spacers 28. The epitaxial semiconductor material forming source/drain regions 38, 40 grows adjacent to an exterior surface 52 of spacers 32.

In an embodiment, the raised source/drain regions 34, 36, 38, 40 may be formed by a selective epitaxial growth process in which semiconductor material nucleates for epitaxial growth on semiconductor surfaces, but does not nucleate for epitaxial growth from insulator surfaces. The semiconductor material of the raised source/drain regions 34, 36 and/or the raised source/drain regions 38, 40 may comprise a p-type dopant selected from Group III of the Periodic Table (e.g., boron (B)) that is effective to impart p-channel conductivity. Alternatively, the semiconductor material of the raised source/drain regions 34, 36 and/or the raised source/drain regions 38, 40 may comprise an n-type dopant from Group V of the Periodic Table (e.g., phosphorus (P) or arsenic (As)) that is effective to impart n-channel conductivity. As used herein, the term "source/drain region" means a doped region of semiconductor material that can function as either a source or a drain of a field effect transistor.

The field-effect transistor 20 includes a channel 46 that is located between its raised source/drain regions 34, 36 and beneath its gate structure with the gate electrode 24 separated from the channel 48 by the gate dielectric 26. The channel 46 is comprised of semiconductor material from the substrate 10 in the active device region 16. The field effect transistor 22 includes a channel 47 that is located between its raised source/drain regions 38, 40 and beneath its gate structure with the gate electrode 25 separated from the channel 47 by the gate dielectric 27. The channel 47 is comprised of semiconductor material from the substrate 10 in the active device region 18. If the field-effect transistors 20, 22 are of different types, one or the other of the active device regions 16, 18 may include a well doped to have an opposite conductivity type from the substrate 10. In an embodiment, the channels 46, 47 may be comprised of p-type semiconductor material, in which instance the field-effect transistors 20, 22 are each p-channel field effect transistors.

In the representative embodiment, the respective portions of the source/drain regions 34, 36 of field-effect transistor 20 located outside of the trenches 35, 37 have a different morphology than the respective portions of the source/drain regions 38, 40 of field-effect transistor 22 located outside of the trenches 39, 41. As a result of the different morphology, the respective top surfaces 54 of the source/drain regions 34, 36 of field-effect transistor 20 have a different topology than respective top surfaces 56 of the source/drain regions 38, 40 of field-effect transistor 22. After the growth fronts for source/drain regions 34, 36 emerge from the trenches 35, 37 and the growth fronts for source/drain regions 38, 40 emerge from the trenches 39, 41, the growth fronts for the epitaxial semiconductor material of the common layer may exhibit a dependence on the respective deposition conditions for the materials of the spacers 28, 32. Differences in the deposition conditions may impact one or more bulk (volume) properties and/or one or more surface properties (e.g., roughness, atomic density, surface charge, defectivity, reflectivity, thermal coefficient, etc.) of the material forming spacers 28 and the material forming spacers 32.

In an embodiment, the material of the source/drain regions 34, 36, 38, 40 may be comprised of silicon-germanium from a common layer that is grown by a non-selective epitaxial process. If the materials of the spacers 28, 32 are comprised of silicon nitride deposited at different temperatures, the epitaxial silicon-germanium in the raised portion of the source/drain regions 34, 36 of field-effect transistor 20 may have a "popped" appearance, and the epitaxial silicon-germanium in the raised portion of the source/drain regions 38, 40 of field-effect transistor 22 may have a "pinned" appearance.

The source/drain regions 38, 40 of field-effect transistor 22 have top surfaces 56 that are non-planar inasmuch as the epitaxial silicon-germanium does not grow vertically above the side surfaces 52 of the spacers 32 beginning at the vertical location of a portion of the spacers 32 that is closest to the respective mouths of the trenches 35, 37 and initially encountered by the silicon-germanium growth front exiting from the respective mouths of the trenches 35, 37 during growth. The height of the epitaxial silicon-germanium relative to the respective mouths of the trenches 35, 37 is not uniform and, in particular, the height of the top surface 56 at a location adjacent to the side surfaces 52 of the spacers 32 differs from the height at other locations on the top surface 56. As the growth front of the epitaxial silicon-germanium emerges from the mouths of the trenches 39, 41 and advances vertically, the portion of the vertical growth front adjacent to the respective spacers 32 stops at the initially-encountered edge of the spacer 32 and does not continue to advance vertically adjacent to and along the side surface 52 of the spacer 32. Vertical growth of the epitaxial silicon-germanium continues at other locations on the top surfaces 56 that are spaced from the initial edge of the spacers 32, which gives rise to the non-planar shape in which the top surfaces 56 each have a planar surface portion and inclined surface portions extending from the initial edge of the spacers 32 to the planar surface portion.

The portions of the source/drain regions 38, 40 respectively projecting out of the trenches 39, 41 have a trapezoidal shape, which contrasts with the rectangular shape of the source/drain regions 34, 36 that project out of the trenches 35, 37. The presence of the inclined surface portions of the top surfaces 56 result in the exposure of the side surfaces 52 of the spacers 32, which are not covered by the semiconductor material of the source/drain regions 38, 40. A gap is present between the inclined surface portions of the respective top surfaces 56 of the source/drain regions 38, 40 and the respective side surfaces 52 of the spacers 32, and the gap grows in width with increasing distance from the portion of the spacers 32 at the initial edge encountered by the growth front for the epitaxial silicon-germanium emerging from the trenches 39, 41.

The volume and/or surface properties of the low-temperature silicon nitride constituting the spacers 32 are factors that influence the growth and provide the non-planarity of the top surfaces 56. In particular, grown of the epitaxial silicon-germanium of the source/drain regions 38, 40 is constrained by the spacers 32. Because the epitaxial silicon-germanium of the source/drain regions 38, 40 does not grow along the side surfaces 52 of the adjacent structure constituted by the spacers 32 and stops its vertical growth at the location 31 at which the respective edges of the spacers 32 are initially encountered, the epitaxial silicon-germanium is considered to have a "pinned" relationship with respect to the spacer 32. This location 31 is vertically positioned near the top surface of the active device region 18 and is proximate to respective horizontal interfaces between the conformal layer 30 and the spacers 32. In an embodiment in which the conformal layer 30 is absent because the vicinity of the field effect transistor 22 is masked when the conformal layer 30 is formed, the location 31 defined by these respect horizontal interfaces may be between a lower surface of the spacers 32 and the active device region 18 contacted by the lower surface of the spacers 32.

The source/drain regions 34, 36 of field-effect transistor 20 have top surfaces 54 that differ in appearance from the top surfaces 56 of the source/drain regions 38, 40 of field-effect transistor 22. As the growth front of the epitaxial silicon-germanium emerges from the mouths of the trenches 35, 37 and advances vertically, the portion of the growth front adjacent to the spacers 28 does not stop as the edge of the spacers 32 is encountered and continues to grow along the side surfaces 52 of the spacers 32. In an embodiment, the top surfaces 56 of the source/drain regions 38, 40 may be flat or planar inasmuch as the height of the epitaxial silicon-germanium relative to the mouth of the trenches 35, 37 is uniform.

The volume and/or surface properties of the high-temperature silicon nitride constituting the spacers 28 are factors that influence the growth to provide the planarity of the top surface 54 and differ from the volume and/or surface properties of the low-temperature silicon nitride constituting the spacers 32. Because the epitaxial silicon-germanium of the source/drain regions 34, 36 grows along the side surfaces 50 of the adjacent structure constituted by the spacers 28 and does not stop at the spacers 28, the epitaxial silicon-germanium is colloquially considered to have a "popped" relationship with respect to the spacer 28.

In accordance with embodiments of the invention, the morphology of the epitaxial semiconductor material (e.g., silicon-germanium) can be tailored proximate to different device regions without changing the growth process conditions and can act locally on different devices. The shape difference of the epitaxial semiconductor material in the device regions may impact device and circuit performance. The shape difference of the epitaxial semiconductor material in the source/drain regions 34, 36, 38, 40, which results from the spacers 28, 32 being formed from materials (e.g., nitride films deposited at different temperatures) characterized by different surface and bulk properties (e.g., spacers formed from nitride films deposited at different temperatures) may impact device and circuit performance of the field-effect transistors 20, 22. The different nitride films may be patterned across a chip, which may result in devices (e.g., field-effect transistors) with varying resistance and/or capacitances due to the tailored shape of the epitaxial semiconductor material in the raised source/drain regions 34, 36, 38, 40. In the representative use case, the field-effect transistors 20 with source/drain regions 34, 36 having a "popped" shape may exhibit a better resistance (Rext) and less probability of yield degrade due to silicide encroachments at the corners between the spacers 28 and the epitaxial semiconductor material, and the field-effect transistors 22 with source/drain regions 38, 40 having a "pinned" shape may exhibit a lower parasitic capacitance (Ceff). The ability to tailor the morphology of the epitaxial semiconductor material through the selection of the material for spacers may reduce reliance on existing techniques that control the deposition process, which are more difficult to control and lack the ability to act locally in different specific areas of a chip. Moreover, changing the deposition conditions may also impact the amount of stress incorporated into the epitaxial semiconductor material, which might be undesirable.

Standard silicidation, middle-of-line (MOL) processing, and back-end-of-line (BEOL) processing follows, which includes formation of contacts and wiring for the local interconnect structure overlying the field-effect transistors, and formation of dielectric layers, via plugs, and wiring for an interconnect structure coupled by the interconnect wiring with the field-effect transistors, as well as other similar contacts for additional device structures fabricated on the substrate 10. After processing is completed, the substrate 10 may be diced into multiple chips each including one or more integrated circuits.

In alternative embodiments, the spacers 28, 32 may be formed from the same conformal layer of dielectric material (e.g., silicon nitride grown at a single temperature). The field-effect transistors 20 may be covered with a mask (e.g., resist) and then the spacers 32 of the field-effect transistors 22 may be subjected to a post-deposition process treatment that changes the bulk properties and/or surface properties of the constituent dielectric material, and thereby the selectivity of the growth of silicon-germanium on the spacer sidewall. Such process treatments include, but are not limited, to treatments such as surface oxidation, fluorination, neutral/charged ion implantation, etc. The process treatment to the spacers 32, but not to the spacers 28, may result in the epitaxial semiconductor material of the source/drain regions 34, 36 being grow adjacent to the spacers 28 with a popped appearance and the epitaxial semiconductor material of the source/drain regions 38, 40 being grow adjacent to the spacers 32 with a pinned appearance.

In the representative embodiment, the device structures are field-effect transistors and the structural features that influence the morphology of the epitaxially grown semiconductor material are spacers on the sidewalls of the gate structures of the field-effect transistors. However, the embodiments of the invention are not so limited and may be applied to other types of device structures and other types of structural features associated with those device structures. For example, the device structures may be vertical bipolar junction transistors in which the structural features are spacers located on the emitter sidewalls, and the semiconductor material may be, for example, a base layer.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refers to a direction perpendicular to the horizontal, as just defined. The term "lateral" refers to a direction within the horizontal plane. Terms such as "above" and "below" are used to indicate positioning of elements or structures relative to each other as opposed to relative elevation.

A feature may be "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
    forming a first sidewall spacer associated with a first device structure;
    after the first sidewall spacer is formed, forming a second sidewall spacer associated with a second device structure;
    after the first sidewall spacer and the second sidewall spacer are formed, forming a first section of a semiconductor material that is located adjacent to the first sidewall spacer of the first device structure and that has a popped relationship relative to the first sidewall spacer of the first device structure; and
    forming a second section of the semiconductor material that is located adjacent to the second sidewall spacer of the second device structure and that includes a portion that has a pinned relationship relative to a portion of the second sidewall spacer of the second device structure,
    wherein the first section of the semiconductor material and the second section of the semiconductor material are concurrently formed on a substrate, the first sidewall spacer is formed from a first silicon nitride deposited by first deposition conditions, the second sidewall spacer is formed from a second silicon nitride deposited by second deposition conditions, and the first deposition conditions are different from the second deposition conditions, wherein forming the first sidewall spacer associated with the first device structure comprises:

heating the substrate to a first process temperature; and conformally depositing the first silicon nitride while the substrate is heated to the first process temperature, and wherein forming the second sidewall spacer associated with the second device structure comprises:

heating the substrate to a second process temperature that is less than the first process temperature; and conformally depositing the second silicon nitride while the substrate is heated to the second process temperature.

2. The method of claim 1 further comprising:

masking the first device structure and the first sidewall spacer during the deposition of the second silicon nitride.

3. The method of claim 1 wherein the first silicon nitride is deposited by low pressure chemical vapor deposition or atomic layer deposition, and the second silicon nitride is deposited by plasma-enhanced chemical vapor deposition.

4. The method of claim 1 wherein the first process temperature is in a range of 600° C. to 800° C., and the second process temperature in a range of 200° C. to 400° C.

5. The method of claim 1 wherein the first silicon nitride and the second silicon nitride have at least one different surface property, at least one different bulk property, or a combination thereof.

* * * * *